(12) United States Patent
Grover et al.

(10) Patent No.: US 9,305,633 B2
(45) Date of Patent: Apr. 5, 2016

(54) SRAM CELL AND CELL LAYOUT METHOD

(71) Applicant: STMicroelectronics International N.V., Schiphol (NL)

(72) Inventors: Anuj Grover, New Delhi (IN); Gangaikondan Subramani Visweswaran, New Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 25 days.

(21) Appl. No.: 14/283,120

(22) Filed: May 20, 2014

(65) Prior Publication Data

US 2015/0302917 A1     Oct. 22, 2015

Related U.S. Application Data

(60) Provisional application No. 61/981,048, filed on Apr. 17, 2014.

(51) Int. Cl.

| G11C 11/00 | (2006.01) |
|---|---|
| G11C 11/412 | (2006.01) |
| G11C 5/02 | (2006.01) |
| G11C 11/415 | (2006.01) |
| G11C 11/413 | (2006.01) |
| G11C 11/419 | (2006.01) |
| G11C 11/416 | (2006.01) |
| G11C 11/411 | (2006.01) |

(52) U.S. Cl.
CPC ............ *G11C 11/412* (2013.01); *G11C 5/02* (2013.01); *G11C 11/413* (2013.01); *G11C 11/415* (2013.01); *G11C 11/416* (2013.01); *G11C 11/419* (2013.01); *G11C 11/4116* (2013.01)

(58) Field of Classification Search
CPC .. G11C 11/412; G11C 11/413; G11C 11/414; G11C 11/415; G11C 11/416; G11C 11/419; G11C 11/4116
USPC ........................................ 365/154, 155, 156
See application file for complete search history.

(56) References Cited

U.S. PATENT DOCUMENTS

| 6,654,276 | B2 | 11/2003 | Brooks | |
|---|---|---|---|---|
| 6,781,870 | B1 | 8/2004 | Kushida | |
| 7,177,177 | B2 * | 2/2007 | Chuang et al. | ............... 365/154 |
| 7,817,460 | B2 | 10/2010 | Yamagami | |
| 8,009,463 | B2 * | 8/2011 | Liaw | ............................ 365/154 |

(Continued)

OTHER PUBLICATIONS

Chen, C.F. et al., "A 210mV 7.3MHz 8T SRAM with Dual Data-Aware Write Assists and Negative Read Wordline for High Cell-Stability, Speed and Area-Efficiency," 2013 Symposium on VLSI Circuits Digest of Technical Papers, 2013, 2 pages.

(Continued)

*Primary Examiner* — Pho M Luu
(74) *Attorney, Agent, or Firm* — Slater & Matsil, LLP

(57) ABSTRACT

Embodiments include an array of SRAM cells, an SRAM cell, and methods of forming the same. An embodiment is an array of static random access memory (SRAM) cells including a plurality of overlapping rectangular regions. Each of overlapping rectangular regions including an entire first SRAM cell, a portion of a second adjacent SRAM cell in a first corner region of the rectangular region, and a portion of a third adjacent SRAM cell in a second corner region of the rectangular region, the second corner region being opposite the first corner region. Embodiments also include multi-finger cell layouts.

36 Claims, 16 Drawing Sheets

(56) References Cited

U.S. PATENT DOCUMENTS

| | | | |
|---|---|---|---|
| 8,189,368 B2 * | 5/2012 | Liaw | 365/154 |
| 8,531,907 B2 * | 9/2013 | Ostermayr et al. | 365/230.05 |
| 8,724,374 B1 | 5/2014 | Grover et al. | |
| 8,921,197 B2 * | 12/2014 | Bentum et al. | 438/373 |
| 2006/0114020 A1 | 6/2006 | Taheri et al. | |

OTHER PUBLICATIONS

Fujiwara, H. et al., "A 20nm 0.6V 2.1uW/MHz 128kb SRAM with No Half Select Issue by Interleave Wordline and Hierarchical Bitline Scheme," 2013 Symposium on VLSI Circuits Digest of Technical Papers, 2013, 2 pages.

Kushida, K. et al., "A 0.7V Single-Supply SRAM with 0.495um2 Cell in 65nm Technology Utilizing Self-Write-Back Sense Amplifier and Cascaded Bit Line Scheme," 2008, Symposium on VLSI Circuits Digest of Technical Papers, 2 pages.

Mukhopadhyay, S. et al., "Capacative Coupling Based Transient Negative Bit-Line Voltage (Tran-NBL) Scheme for Improving Write-ability of SRAM Design in Nanometer Technologies," May 18-21, 2008, 2008 IEEE Symposium on Circuits and Systems, 4 pages.

Nho, H. et al., "A 32nm High-k Metal Gate SRAM with Adaptive Dynamic Stability Enhancement for Low-Voltage Operation," 2010, 2010 IEEE Journal of Solid-State Circuits Conference, 3 pages.

Nii, K. et al., "A 45-nm Single-Port and Dual-port SRAM Family with Robust Read/Write Stabilizing Circuitry under DVFS Environment," 2008, 2008 Symposium on VLSI Circuits Digest of Technical Papers, 2 pages.

Wang, Y. et al., "A 4.0 GHz 291 Mb Voltage-Scalable SRAM Design in 32nm High-k Metal-Gate CMOS with Integrated Power Management," 2009, 2009 IEEE International Solid-State Circuits Conference, 3 pages.

Yamaoka, M. et al., "90-nm Process-Variation Adaptive Embedded SRAM Modules with Power-Line-Floating Write Technique," IEEE Journal of Solid-State Circuits, vol. 41, No. 3, Mar. 2006, 7 pages.

* cited by examiner

US 9,305,633 B2

SRAM CELL AND CELL LAYOUT METHOD

PRIORITY CLAIM

This application claims the benefit of U.S. Provisional Application Ser. No. 61/981,048, filed on Apr. 17, 2014, entitled "SRAM Cell and Cell Layout Method," which application is hereby incorporated herein by reference.

TECHNICAL FIELD

The present invention relates to integrated memory circuits and in particular to a static random access memory (SRAM) cell integrated circuit.

BACKGROUND

Reference is made to FIG. 1 which shows a schematic diagram of a standard six transistor (6T) static random access memory (SRAM) cell 10. The cell 10 includes two cross-coupled complement metal-oxide-semiconductor (CMOS) inverters, each inverter including a series connected p-channel MOSFET (PMOS) and n-channel MOSFET (NMOS) transistor pair. A first inverter includes a PMOS transistor 12 and an NMOS transistor 14, and a second inverter includes a PMOS transistor 16 and an NMOS transistor 18. The inputs and outputs of the inverters are coupled to form a latch circuit having a true data storage (DST) node and a complement data storage (DSC) node. The cell 10 further includes two access transistors (sometimes referred to as passgate or transfer transistors) 24 and 26 whose gate terminals are coupled with a wordline node and are controlled by the signal present at the wordline node (WL). The transistor 24 is source-drain connected between the DST node and a node associated with a true bitline (BLT). The transistor 26 is source-drain connected between the DSC node and a node associated with a complement bitline (BLC). The source terminals of the PMOS transistors 12 and 16 in each inverter are coupled to receive a high supply voltage (for example, VDD) at a high voltage node $V_H$, while the source terminals of the NMOS transistors 14 and 18 are coupled to receive a low reference voltage (for example, ground) at a low voltage node $V_L$. The high supply voltage VDD at the node $V_H$ and the low reference voltage ground at the node $V_L$ comprise the power supply set of voltages for the cell 10.

The reference above to a 6T SRAM cell 10 of FIG. 1 for use as the data storage element is made by way of example only, it being understood to those skilled in the art that the cell 10 could alternatively comprise a different data storage element. The use of the term SRAM cell will accordingly be understood to refer any suitable memory cell or date storage element, with the circuitry, functionality, and operations presented herein in the exemplary context of a 6T SRAM cell.

SUMMARY OF THE INVENTION

An embodiment is an array of static random access memory (SRAM) cells including a plurality of overlapping rectangular regions. Each of overlapping rectangular regions including an entire first SRAM cell, a portion of a second adjacent SRAM cell in a first corner region of the rectangular region, and a portion of a third adjacent SRAM cell in a second corner region of the rectangular region, the second corner region being opposite the first corner region.

Another embodiment is a static random access memory (SRAM) cell including a first pull-up transistor having an active area, and a second pull-up transistor having an active area. The SRAM further includes a first pull-down transistor, and a first access transistor, wherein active areas for the first pull-down transistor and the first access transistor are between the active areas of the first pull-up transistor and the second pull-up transistor.

A further embodiment is a static random access memory (SRAM) cell including a first pull-up transistor, a first pull-down transistor, and a first read access transistor. The SRAM cell further includes a second pull-up transistor, a second pull-down transistor, and a second read access transistor. The active areas of each of the first pull-down transistor, the first read access transistor, the second pull-down transistor, and the second read access transistor have more than one gate electrodes extending over their respective active areas.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to embodiments in a specific context, namely an 8T SRAM cell and layout. Some of the various embodiments described herein include 8T SRAM cells and layouts for use in on-chip cache of mobile systems, computing systems, or any system which can utilize low voltage SRAM. In other embodiments, aspects may also be applied to other applications involving any type of SRAM cell according to any fashion known in the art.

According to embodiments disclosed herein, an 8T SRAM cell topology, layout, and read/write assist schemes are presented to effectively expand the operating range, for example, of a 32 Kbit SRAM instance from about 0.35V to about 1.3V. The described read/write assist schemes utilize the ability of Ultra-Thin Body and BOX Fully Depleted Silicon On Insulator (UTBB FDSOI) technology to apply body bias and to enhance circuit functionality. The described zigzag multi-finger cell layout enables bit-interleaving which improves the soft error resilience (SER), and also supports up to 5 wordline tracks over a memory cell.

Figure 2:
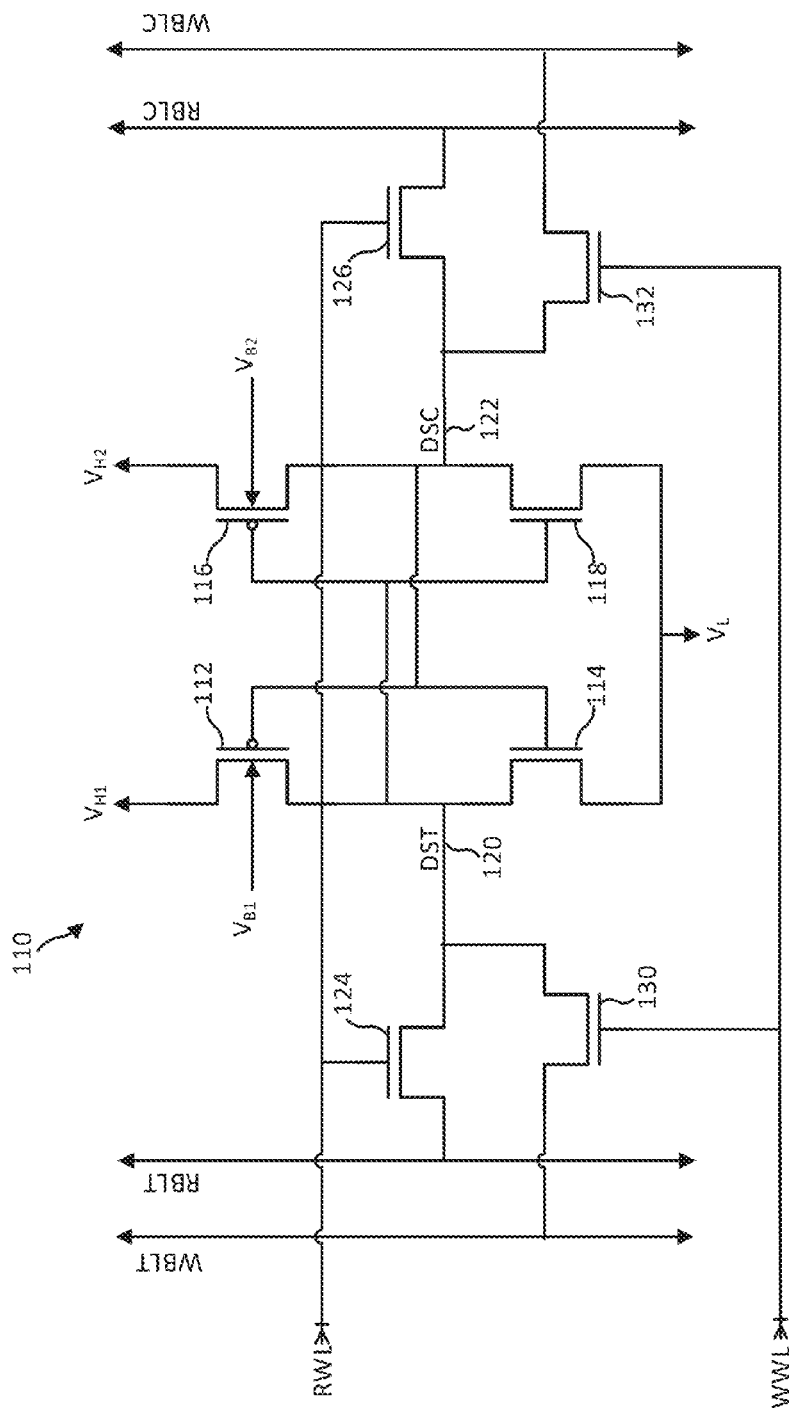
FIG. 2 illustrates a schematic diagram of an eight transistor (8T) SRAM cell in accordance with an embodiment.

FIG. 2 illustrates a schematic diagram of an eight transistor (8T) SRAM cell 110 in accordance with an embodiment. The cell 110 includes two cross-coupled CMOS inverters, each inverter including a series PMOS and NMOS transistor pair. A first inverter includes a PMOS transistor 112 (pull-up transistor) and an NMOS transistor 114 (pull-down transistor), and a second inverter includes a PMOS transistor 116 (pull-up transistor) and an NMOS transistor 118 (pull-down transistor). The inputs and outputs of the inverters are coupled to form a latch circuit having a true data storage (DST) node and a complement data storage (DSC) node.

The cell 110 further includes two read access transistors 124 and 126 whose gate terminals are coupled with a read wordline node and are controlled by the signal present at the read wordline node (RWL). The transistor 124 is source-drain connected between the DST node and a node associated with a true read bitline (RBLT). The transistor 126 is source-drain connected between the DSC node and a node associated with a complement read bitline (RBLC).

The cell 110 further includes two write access transistors 130 and 132 whose gate terminals are coupled with a write wordline node and are controlled by the signal present at the write wordline node (WWL). The transistor 130 is source-drain connected between the DST node and a node associated with a true write bitline (WBLT). The transistor 132 is source-drain connected between the DSC node and a node associated with a complement write bitline (WBLC). The RBLT and RBLC are used to carry data during a read operation, while the WBLT and WBLC are used to carry data during a write operation.

Figure 1:
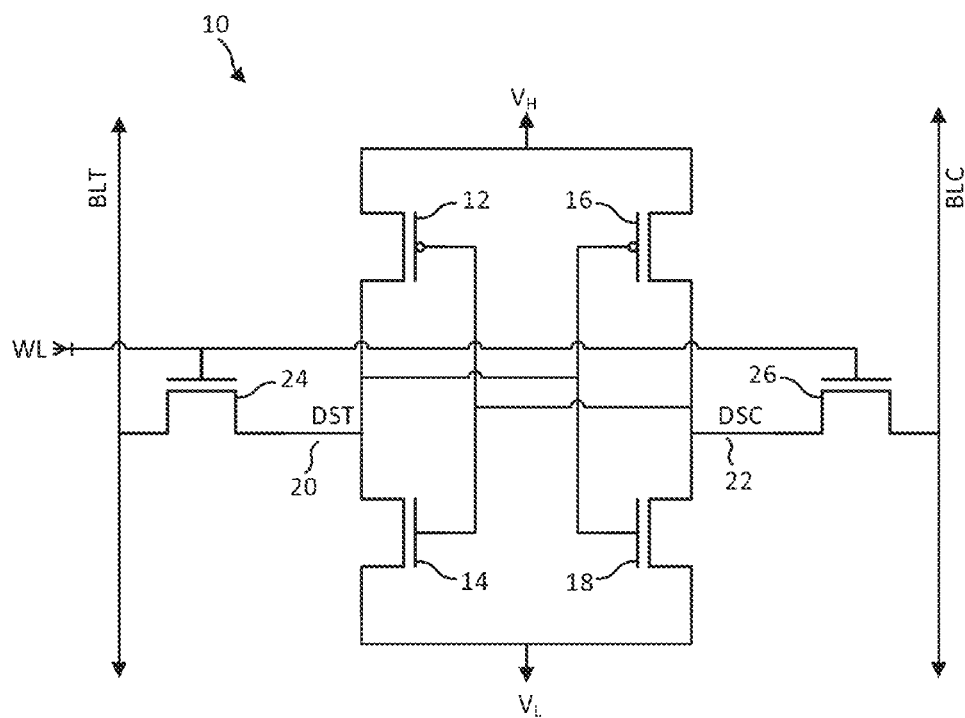
FIG. 1 illustrates a schematic diagram of a standard six transistor (6T) static random access memory (SRAM) cell.

By having separate read access transistors 124 and 126 and write access transistors 130 and 132, rather than a single access transistor providing both read and write access (see FIG. 1), the read and write operations for the SRAM cell 110 are decoupled from each other. This allows for the transistors can be sized based on the specific requirements of read or write operations. For example, the read access transistors 124 and 126 can be sized smaller for read stability and to stay within read current constraints, and the write access transistors 130 and 132 can be sized larger to improve write-ability and write time. In addition, the transistors of the SRAM cell 110 may be low threshold voltage (LVT) devices to ensure functionality and performance across an ultra wide voltage range (UWVR). For example, the SRAM cell 110 can have an operating voltage ranging from about 0.35V to about 1.3V. This operating voltage range extends from the low-voltage ultra-low-power range to the high power range.

The source terminal of the PMOS transistor 112 of the first inverter is coupled to receive a high supply voltage at a first high voltage node $V_{H1}$, while the source terminal of the NMOS transistor 114 of the first inverter is coupled to receive a low reference voltage (for example, ground) at a low voltage node $V_L$. The body (or bulk) terminal of the PMOS transistor 112 is coupled to receive a body bias voltage at a first body bias node $V_{B1}$.

The source terminal of the PMOS transistor 116 of the second inverter is coupled to receive a high supply voltage at a first high voltage node $V_{H2}$, while the source terminal of the NMOS transistor 118 of the second inverter is coupled to receive a low reference voltage (for example, ground) at a low voltage node $V_L$. The body (or bulk) terminal of the PMOS transistor 116 is coupled to receive a body bias voltage at a first body bias node $V_{B2}$.

In some embodiments, the first high voltage node $V_{H1}$ and the second high voltage node $V_{H2}$ are independent of each other. By this, it is meant that same high supply voltage need not be applied simultaneously to those nodes, and in a certain operating mode of the SRAM cell 110 the voltages applied to the first high voltage node $V_{H1}$ and second high voltage node $V_{H2}$ will purposely be different from each other. In this context, it will be understood that the supply voltages applied to the first high voltage node $V_{H1}$ and the second high voltage node $V_{H2}$ are each different from the ground or reference voltage for the SRAM cell 110 at the node $V_L$. In some other embodiments, the first high voltage node $V_{H1}$ and the second high voltage node $V_{H2}$ are not independent of each other and are a same voltage.

In some embodiments, the first body bias node $V_{B1}$ and the second body bias node $V_{B2}$ are independent of each other. By this, it is meant that a same body bias voltage need not be applied simultaneously to those nodes, and in a certain operating mode of the SRAM cell 110 the voltages applied to the first body bias node $V_{B1}$ and second body bias node $V_{B2}$ will purposely be different from each other. In this context, it will be understood that the body bias voltages applied to the first body bias node $V_{B1}$ and second body bias node $V_{B2}$ are each different from the ground or reference voltage for the SRAM cell 110 at the node VL. In some other embodiments, the first body bias node $V_{B1}$ and the second body bias node $V_{B2}$ are tied to the first high voltage node $V_{H1}$ and the second high voltage node $V_{H2}$, respectively.

In some embodiments, a voltage supply circuit (not shown) for the SRAM cell 110 is coupled to the first high voltage node $V_{H1}$ and to the second high voltage node $V_{H2}$ to supply the high voltages to the SRAM cell 110. The voltage supply circuit is configured to supply selectively apply at least two different supply voltages to the first high voltage node $V_{H1}$ and at least two different supply voltages to the second high voltage node $V_{H2}$. The selection of the supply voltages to be output to the first and second high voltage nodes $V_{H1}$ and $V_{H2}$ is dependent on SRAM cell 110 mode of operation (read versus write) and more particularly is dependent on the logic state of the data being written into the SRAM cell 110.

In some embodiments, the voltage supply circuit is further coupled to the first body bias node $V_{B1}$ and to the second body bias node $V_{B2}$. The voltage supply circuit is configured to supply selectively apply at least two different body bias voltages to the first body bias node $V_{B1}$ and at least two different supply voltages to the second body bias voltage node $V_{B2}$.

The selection of the body bias voltages to be output to the first and second body bias voltage nodes $V_{B1}$ and $V_{B2}$ is dependent on SRAM cell 110 mode of operation (read versus write) and more particularly is dependent on the logic state of the data being written into the SRAM cell 110

In some embodiments, the voltage supply circuit determines which one of the DST node and the DSC node is to be written with a logic high '1', for example, by the logic state present on the WBLT and the WBLC during write mode. In response to that determination, the voltage supply circuit controls the first and second high voltage nodes $V_{H1}$ and $V_{H2}$ such that a relatively higher supply voltage is applied to the one of the first high voltage node $V_{H1}$ or the second high voltage node $V_{H2}$ that is coupled through the PMOS transistor 112 or the PMOS transistor 116 to that one of the DST node and the DSC node that is to be written with a logic high '1'. In further response to that determination, the voltage supply circuit controls the first and second body bias nodes $V_{B1}$ and $V_{B2}$ such that a relatively lower body bias voltage is applied to the one of the first body bias node $V_{B1}$ or second body bias node $V_{B2}$ of the PMOS transistor 112 or the PMOS transistor 116 associated with that one of the DST node and DSC node that is to be written with logic high '1'.

By selectively raising the source supply voltage for the first or second inverter of the SRAM memory cell 110, and/or the selectively lowering the body bias voltage for the PMOS transistor in that inverter, associated with the DST node or the DSC node to which a logic high '1' is being written during a write mode, the strength of the PMOS pull-up transistor (PMOS transistor 112 or PMOS transistor 116) that is writing the logic high '1' to the latch node is improved. This results in an improvement of the write time because the voltage level at the latch node to which the logic high '1' is being written during write mode rises more quickly due to the increased current being supplied by the associated PMOS pull-up transistor. This increased current will limit the "fight" offered by the other PMOS pull-up transistor to the action of the write driver coupled to the bitlines. The result is an improvement in write margin, which lowers the minimum operating voltage ($VDD_{MIN}$) of the SRAM cell 110 during a write operation.

The operation of modifying the supply voltage of the inverters and modifying the body bias voltage of the PMOS pull-up transistors will be referred to as Dynamic Data Dependent Supply and Body Modulation ($D^3SBM$) hereinafter. This operation may be utilized in other SRAM cells designs as described in U.S. patent application Ser. No. 13/655,160 filed on Oct. 18, 2012 and entitled "Data-Dependent Pullup Transistor Supply and Body Bias Voltage Application for a Static Random Access Memory (SRAM) Cell,", which application is incorporated herein by reference.

Figure 3A:
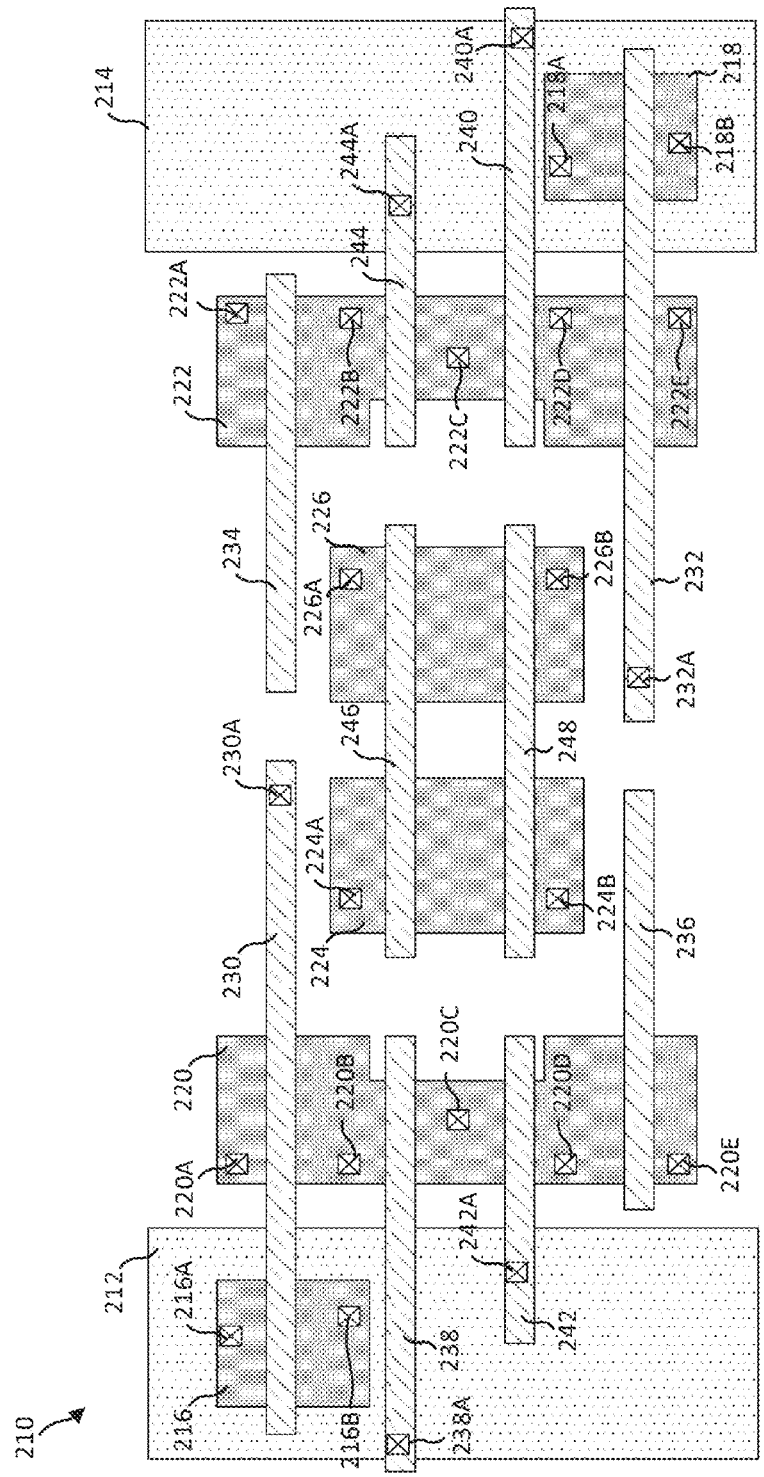
FIG. 3A illustrates a zigzag layout of an 8T SRAM cell in accordance with an embodiment.

FIG. 3A illustrates a zigzag layout of an 8T SRAM cell layout 210 in accordance with an embodiment. The memory layout 210 includes n-wells 212 and 214 on outer edges of the cell layout 210 with one or more p-wells between these n-wells. The memory layout 210 further includes active areas 216 and 218 in the n-wells, which will be the active areas for the subsequently formed PMOS pull-up transistors 412 and 416 (see FIG. 3C), and active areas 220, 222, 224, and 226 between the n-wells 212 and 214. The active area 220 is a connected active area and will be the active area for the subsequently formed pull-down transistor 414 and read access transistor 424 (see FIG. 3C). The active area 222 is a connective active area and will be the active area for the subsequently formed pull-down transistor 418 and read access transistor 426 (see FIG. 3C). The active areas 224 and 226 will be active areas for the subsequently formed write access transistors 430 and 432, respectively.

The transistor active areas are formed in a semiconductor substrate. This step may comprise forming shallow trench isolations (STIs) around each transistor active area. The active areas may be doped with the appropriate n-type or p-type dopants to create n-wells or p-wells for PMOS or NMOS transistors, respectively. Processing may require forming and patterning resist layers in order to form the STIs and the n-wells and p-wells as is known in the art. Alternatively, if fin field effect transistors (FinFETs) are to be formed, this step may comprise forming STIs and etching and doping the semiconductor substrate to form the FinFET active areas. In an embodiment, the substrate comprises Ultra-Thin Body and BOX Fully Depleted Silicon On Insulator (UTBB FDSOI) technology.

After the active areas are formed, a set of gates 230, 232, 234, 236, 238, 240, 242, 244, 246, and 248 are formed over the active areas and the substrate. As illustrated in FIG. 4A, the longitudinal axes of the gates 230, 232, 234, 236, 238, 240, 242, 244, 246, and 248 are substantially parallel to each other. Each of the active areas 220, 222, 224, and 226 has more than one gate extending over them. For example, the active areas 224 and 226 each have gates 246 and 248 extending over them. Although not shown in this embodiment, the gates 230 and 232 may be split to provide more than one gate over each of the active areas 216 and 218 for the pull-up transistors 412 and 416 (for example see FIGS. 6 and 7). This multi-gate (multi-finger) layout provides improved soft error resilience (SER) robustness because each of the subsequently formed transistors are then divided into at least two parts and thus a particle strike will only affect one half of the transistor rather than the entire transistor.

The formation of the gates may include forming a dielectric layer, possibly silicon dioxide, may be formed over the semiconductor substrate. Then a gate electrode layer is formed over the dielectric layer. This gate electrode layer may be polysilicon, metal, or the like. If polysilicon is used, in subsequent steps the gate electrode may be reacted with metal to form a silicide to reduce contact resistance. The dielectric layer and the gate electrode layer are then etched such that the layers remain only on the active areas to form gate electrodes. Similarly, if FinFETs are used, the gate structures will be formed over and around the transistor active areas. Dielectric spacers may be formed along the edges of the gate electrodes, and the gate electrodes may be doped as desired.

After the gates are formed, the source and drain regions for the transistors may be formed. This may involve doping the active areas on either side of the gate for each transistor. Different resist layers may be needed when doping transistors with p-type dopants and when doping transistors with n-type dopants.

FIG. 3A illustrates contacts coupled to the active areas and the gates. For example, contacts 216A and 216B are coupled to the active area 216 and the contact 230A is coupled to the gate 230. The remaining contacts are similarly coupled to the active area or gate that they share a reference number with (e.g., contact 216A coupled to the active area 216). The set of contacts illustrated in FIG. 3A will be used to couple the gates and active areas to a subsequently formed first metallization layer (see FIG. 3B).

The set of contacts in FIG. 3A may be formed by a damascene or dual damascene process where a dielectric layer is formed over the SRAM cell layout 210 and etched to form openings that will become contacts to the active areas or gates of the transistors. Then, a metal such as copper, aluminum, tungsten, nickel, the like, or a combination thereof may be deposited into the openings to form the traces, pads, and contacts. In some embodiments, the contacts are formed in the same process with the subsequently formed first metallization layer.

Figure 3B:
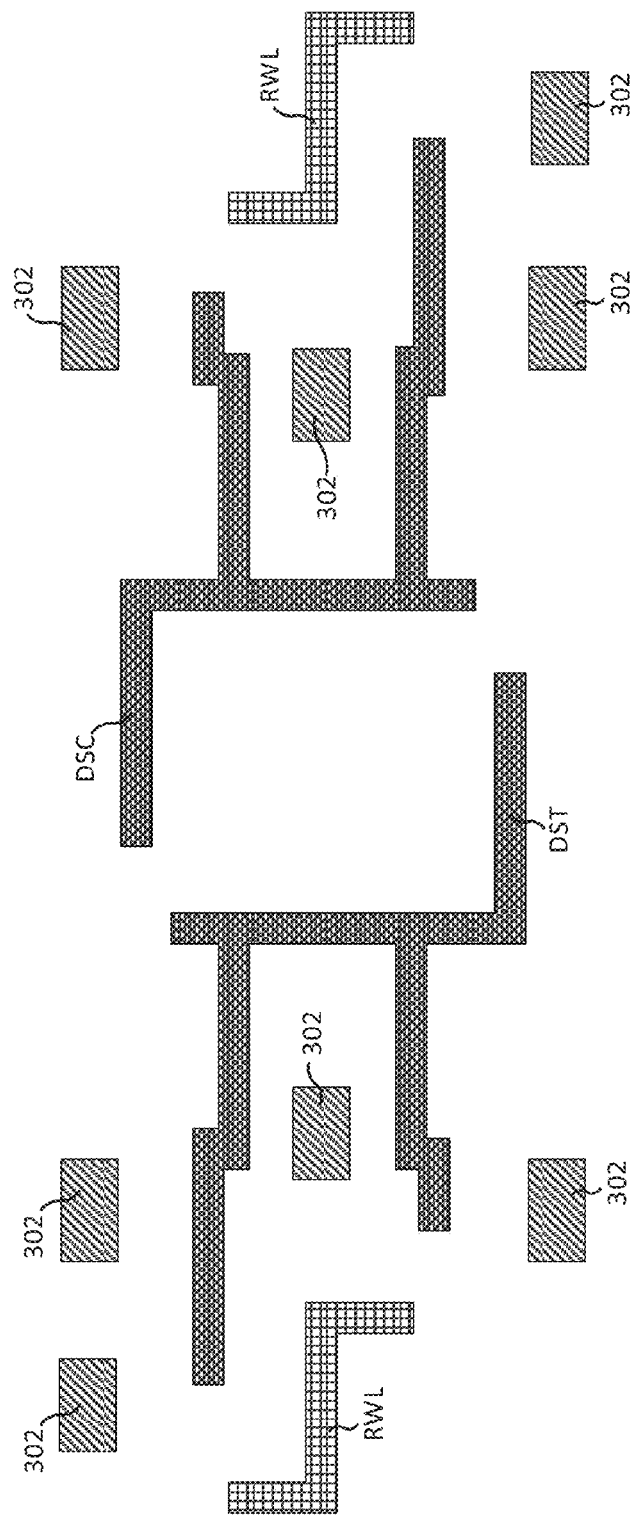
FIG. 3B illustrates a first metallization layer for zigzag layout of the 8T SRAM cell in FIG. 3A in accordance with an embodiment.

FIG. 3B illustrates a first metallization layer for the layout of the 8T SRAM cell in FIG. 3A in accordance with an embodiment. The first metallization layer overlays the SRAM cell layout 210 and is electrically coupled to active areas and gates by way of the contacts illustrated in FIG. 3A. The first metallization layer includes an intra-cell connection trace representing the true data storage (DST) node, an intra-cell connection trace representing the complement data storage (DSC) node, and two intra-cell connection traces representing the read wordline (RWL). The first metallization layer further includes portions 302, which allow a subsequently formed second metallization layer (see FIGS. 3D and 3E) to be electrically coupled to the active areas and gates.

Figure 3C:
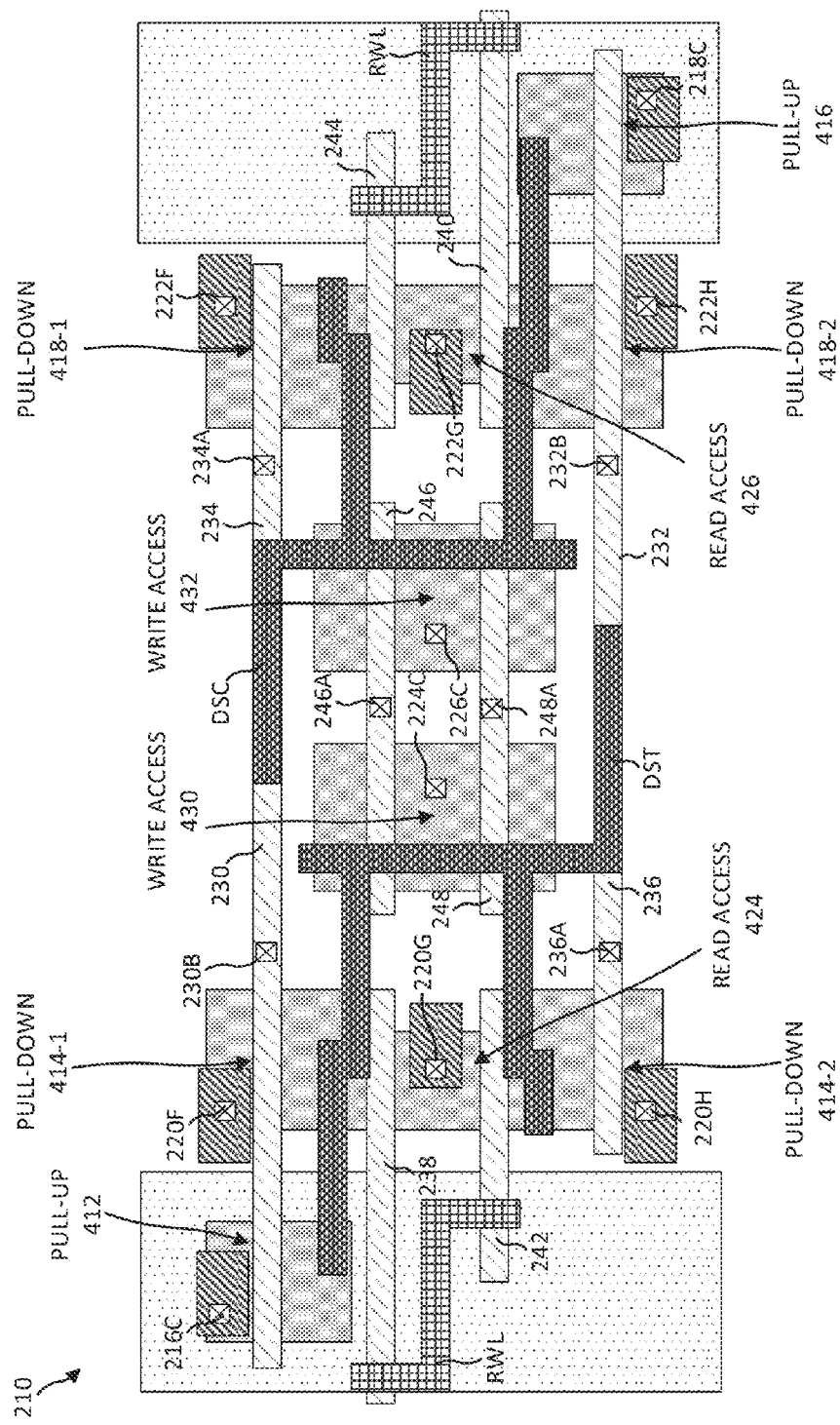
FIG. 3C illustrates the first metallization layer in FIG. 3B over the zigzag layout of the 8T SRAM cell in FIG. 3A in accordance with an embodiment.

FIG. 3C illustrates the first metallization layer in FIG. 3B coupled to the layout of the 8T SRAM cell layout 210 in accordance with an embodiment. The contacts illustrated in FIG. 3C will be used to electrically couple the second metallization layer to the SRAM cell layout 210 (see FIG. 3E). The active area of the first pull-up transistor 412 is electrically coupled by the contact 216A to the contact 216C and by the contact 216B to the DST trace.

The active area of the first pull-down 414 (414-1 and 414-2) is split into two separate active areas that are separated by the active area for the first read access transistor 424. The active areas of the first pull-down transistor 414 and the first read access transistor 424 overlap such that the transistors share the source/drain regions between them. The first active area of the first pull-down 414-1 is electrically coupled by the contact 220A to the contact 220F and by the contact 220B to the DST trace. The second active area of the first pull-down 414-2 is electrically coupled by the contact 220D to the DST trace and by the contact 220E to the contact 220H. The active area of the first read access transistor 424 is electrically coupled to by the contact 220B to the DST trace, by the contact 220C to the contact 220G, and by the contact 220D to the DST trace.

The active area of the first write access transistor 430 is electrically coupled by the contacts 224A and 224B to the DST trace.

The active area of the second pull-up transistor 416 is electrically coupled by the contact 218A to the DSC trace and by the contact 218B to the contact 218C.

The active area of the second pull-down 418 (418-1 and 418-2) is split into two separate active areas that are separated by the active area for the second read access transistor 426. The active areas of the second pull-down transistor 418 and the first read access transistor 426 overlap such that the transistors share the source/drain regions between them. The first active area of the second pull-down 418-1 is electrically coupled by the contact 222A to the contact 222F and by the contact 222B to the DSC trace. The second active area of the second pull-down 418-2 is electrically coupled by the contact 222D to the DSC trace and by the contact 222E to the contact 222H. The active area of the second read access transistor 426 is electrically coupled to by the contact 222B to the DSC trace, by the contact 222C to the contact 222G, and by the contact 222D to the DSC trace.

The active area of the second write access transistor 432 is electrically coupled by the contacts 226A and 226B to the DSC trace.

The gate 230 of the first pull-up transistor 412 and the first pull-down transistor 414 is electrically coupled by the contact 230A to the DSC trace. The gate 232 of the second pull-up transistor 414 and the second pull-down transistor 418 is electrically coupled by the contact 232A to the DST trace. The gates 238 and 242 of the first read access transistor 424 are electrically coupled by the contacts 238A and 242A, respectively, to a first RWL trace. The gates 240 and 244 of the second read access transistor 426 are electrically coupled by the contacts 240A and 244A, respectively, to a second RWL trace.

Figure 3D:
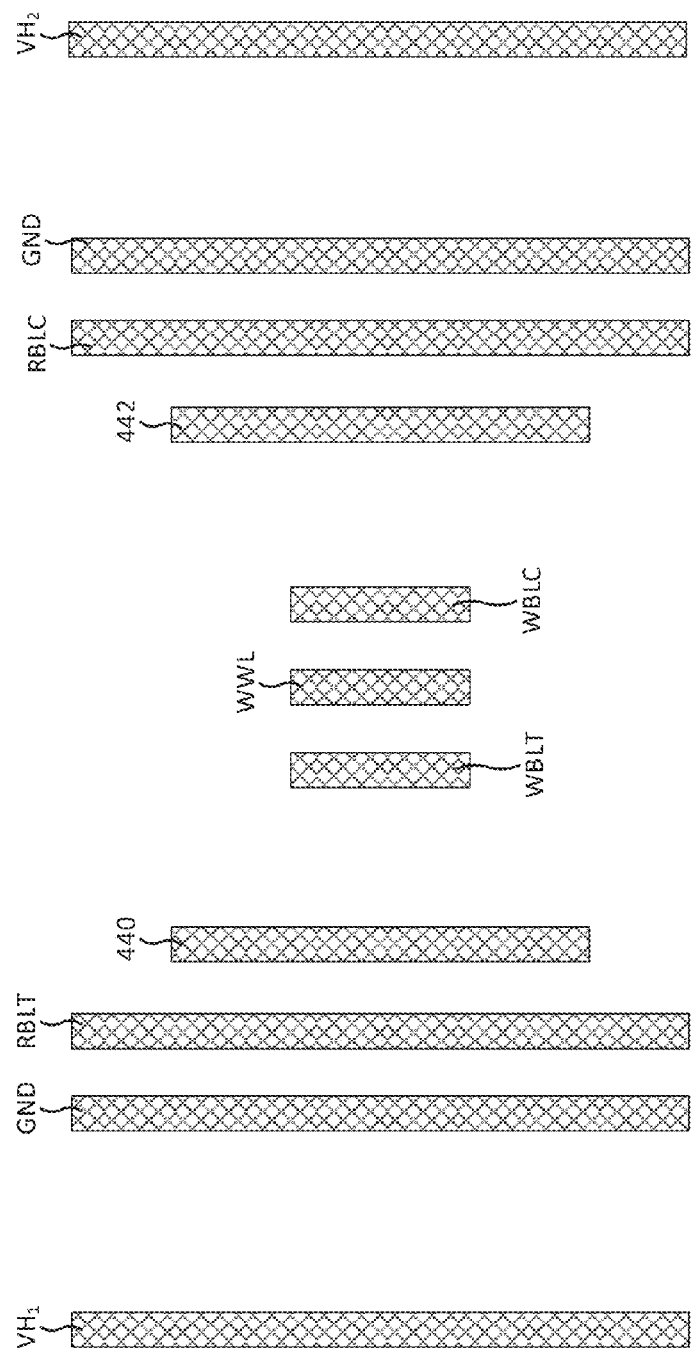
FIG. 3D illustrates a second metallization layer for the zigzag layout of the 8T SRAM cell in FIG. 3C in accordance with an embodiment.

FIG. 3D illustrates a second metallization layer for the layout of the 8T SRAM cell layout 210 in accordance with an embodiment. The second metallization layer overlays the first metallization layer and the SRAM cell layout 210 and is electrically coupled to active areas, gates, and first metallization layer by way of contacts. The second metallization layer includes an inter-cell connection trace representing first supply voltage ($V_{H1}$) node, an inter-cell connection trace representing the second supply voltage ($V_{H2}$) node, an inter-cell connection trace representing the true read bitline (RBLT), an inter-cell connection trace representing the complement read bitline (RBLC), two inter-cell connections representing the ground reference voltages (GND), a linear intra-cell connection trace 440 to electrically couple the gates 230 and 236, a linear intra-cell connection to electrically couple the gates 234 and 232, an intra-cell connection representing the write wordline (WWL), an intra-cell connection trace representing the true write bitline (WBLT), and an intra-cell connection trace representing the complement write bitline (WBLC).

Figure 3E:
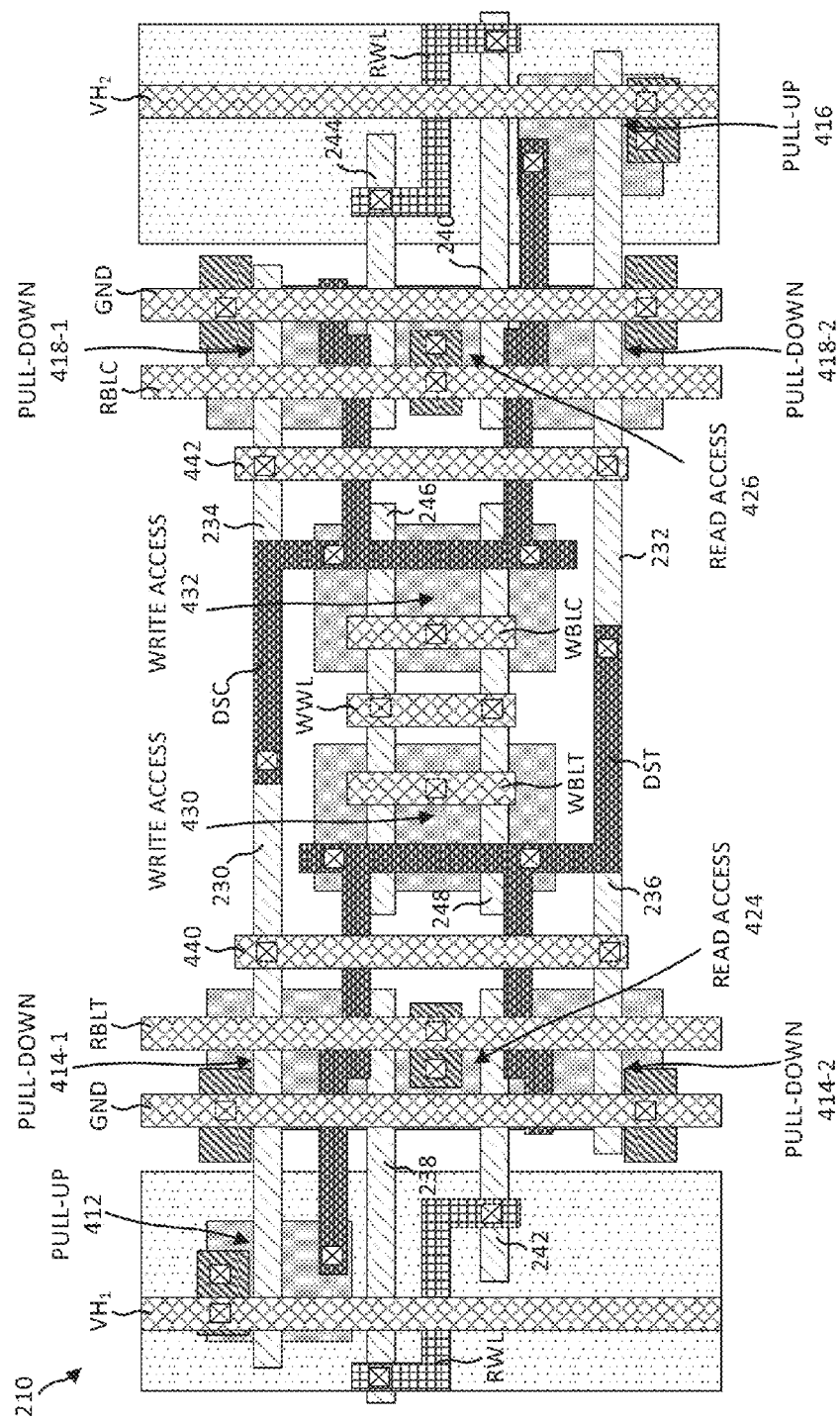
FIG. 3E illustrates the second metallization layer in FIG. 3D with the first metallization layer in the zigzag layout of the 8T SRAM cell in accordance with an embodiment.

FIG. 3E illustrates the second metallization layer in FIG. 3D over the first metallization layer and the layout of the 8T SRAM cell layout 210 in accordance with an embodiment. The active area of the first pull-up transistor 412 is electrically coupled to the $V_{H1}$ trace.

The first active area of the first pull-down transistor 414-1 is electrically coupled to one of the GND traces, and the second active area of the first pull-down transistor 414-2 is electrically coupled to the same GND trace. The active area of the first read access transistor is electrically coupled to the RBLT trace.

The gates 230 and 236 are each electrically coupled to the linear intra-cell connection trace 440.

The active area of the first write access transistor 430 is electrically coupled to the WBLT trace.

The gates 246 and 248 are each electrically coupled to the WWL trace.

The active area of the second pull-up transistor 416 is electrically coupled to the $V_{H2}$ trace.

The first active area of the second pull-down transistor 418-1 is electrically coupled to one of the GND traces, and the second active area of the second pull-down transistor 418-2 is electrically coupled to the same GND trace. The active area of the second read access transistor is electrically coupled to the RBLC trace.

The gates 234 and 232 are each electrically coupled to the linear intra-cell connection trace 442.

The active area of the second write access transistor 432 is electrically coupled to the WBLC trace.

The first and second metallization layers may be formed by a damascene or dual damascene process where a dielectric layer is formed over the memory cell and etched to form openings that will become contacts to the active areas or gates of the transistors and traces and pads of the metallization layers. Then, a metal may be deposited into the openings to form the traces, pads, and contacts. Any excess metal may be removed, such as by a CMP process.

Wordline traces are on a third metallization layer (not shown) overlaying the second metallization layer such that the third metallization layer is separated from the second metallization layer by a dielectric layer or other equivalent layers in an interconnect structure. The wordline traces may be electrically coupled to the WWL trace through vias in the dielectric layer or interconnect structure. A person having ordinary skill in the art will know that the wordline traces generally run perpendicular to the RBLT trace and the RBLC trace such that the wordline traces are typically on a different metal layer than the RBLT trace and the RBLC trace. Otherwise, the traces herein discussed do not necessarily have to be on these layers and may be on any layer. For example, wordline traces may be on the first and second metallization layers along such that the RBLT and RBLC traces are on the second metallization layer. In addition, the $V_{H1}$ trace, the $V_{H2}$ trace, and the GND traces may be on any metallization layer without limitation.

In another embodiment, the read access transistors and the write access transistors can exchange layout positions such that the write access transistors are interposed between the halves of the pull-down transistors. In addition, the SRAM cell layout 210 may have up to five wordlines. In an embodiment, the SRAM cell layout 210 can have 2 RWL lines and 2 WWL lines to implement MUX-2. In another embodiment, the SRAM cell layout 210 can have 4 WWL lines and 1 RWL line such that it can interleave 4 words and implement MUX-4. For example, when the SRAM cell layout 210 has more than one wordline, the capacitance of the DST and DSC nodes may increase to about 2 times the capacitance of the DST and DSC nodes in standard 6T SRAM cell, which can provide additional SER robustness at low voltages.

Figure 3F:
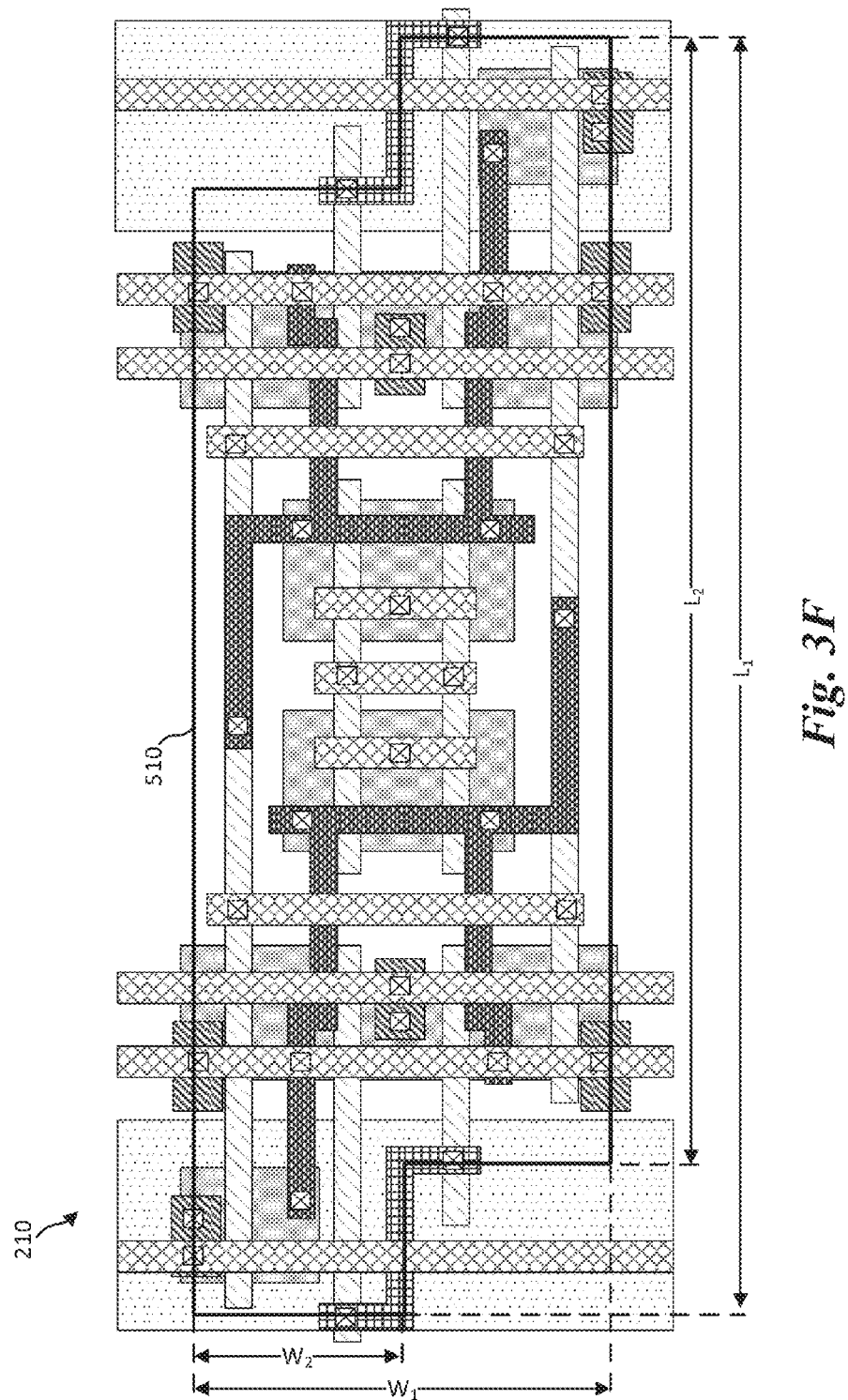
FIG. 3F illustrates a cell boundary for the zigzag layout of the 8T SRAM cell in FIG. 3E in accordance with an embodiment.

FIG. 3F illustrates a cell boundary 510 for the layout of the 8T SRAM cell layout 210 in accordance with an embodiment. The SRAM cell within the cell boundary 510 represents a unit or memory cell. The cell within the cell boundary 510 defines a basic building block for designing memory cells and may be duplicated to create larger memories.

The SRAM cell layout 210 has a zigzag or Z-shape as illustrated in FIG. 3F. The SRAM cell has a total length $L_1$ along a first side and a total width $W_1$ along an adjacent second side. The SRAM cell layout 210 further has an offset or protruding portion on both ends that allow it to interlock with neighboring SRAM cells. The SRAM cell layout 210 has a length $L_2$ along the first side excluding one of the protrusions, and a width $W_2$ along the adjacent second side of one of the protrusions. The length $L_2$ is less than the length $L_1$ and the width $W_2$ is less than the width $W_1$.

The n-wells of the PMOS pull-up transistors of the SRAM cell 110 and the SRAM cell layout 210 need to be separated to enable the body biasing of the $D^3SBM$ assist scheme described above. By forming the SRAM cell in a zigzag layout, only a 3-5% area penalty is incurred, while the enablement of the $D^3SBM$ assist scheme reduces the $VDD_{MIN}$ of the SRAM cell. The zigzag layout also improves the cell aspect ratio, which reduces the wordline capacitance by more than 50% and improves the speed of the SRAM device. The zigzag layout can also provide similar benefits to other SRAM cell topologies such as a 6T SRAM cell or a 10T SRAM cell.

Although the active areas for the PMOS pull-up transistors 412 and 416 have been described as being formed in n-wells, with the UTBB FDSOI technology, it is possible to form the PMOS transistors 412 and 416 in either n-wells or p-wells. In addition, it is possible to form the NMOS transistors (414, 418, 424, 426, 430, and 432) in either p-wells or n-wells. Hence, it is possible that the SRAM cell 110 includes only a p-well (with the PMOS transistors formed in the p-well) or only an n-well (with the NMOS transistors formed in the n-well). This also applies to the embodiments discussed below.

Figure 4:
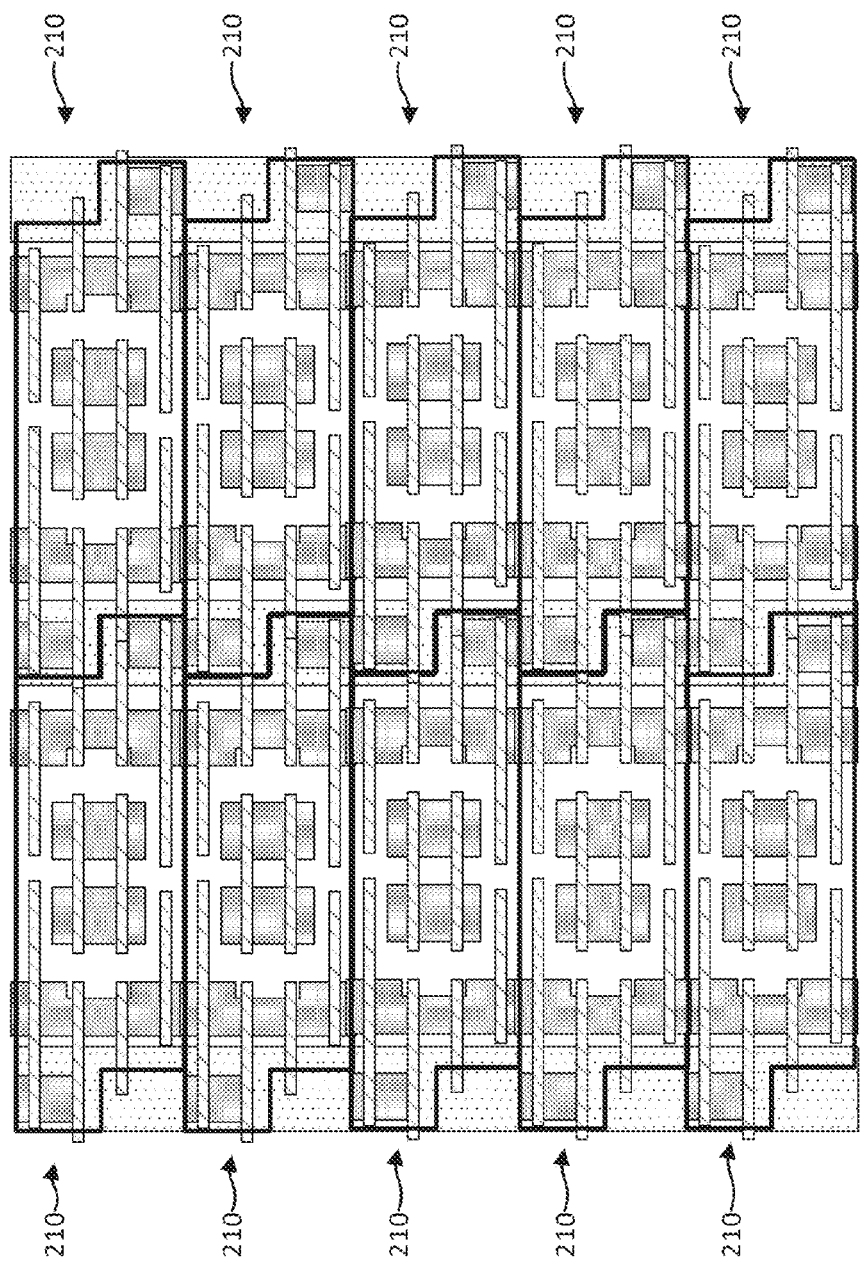
FIG. 4 is a ten SRAM cell layout in accordance with an embodiment.

FIG. 4 is a ten SRAM cell layout in accordance with an embodiment. The individual SRAM cell layouts 210 form an SRAM cell array with the zigzag layout allowing the SRAM cell layouts 210 to interlock with the adjacent cells. The n-wells of the adjacent cells form a continuous n-well that runs along the intersection of the columns of the SRAM cell layouts 210. The RBLT, RBLC, $V_{H1}$, $V_{H2}$, and GND traces can run along an entire column of SRAM cells and be shared amongst all the SRAM cells 210 in that column of the SRAM cell array.

The SRAM cell array formed from the zigzag SRAM cell layouts 210 may be described as overlapping rectangular regions with each of overlapping rectangular regions including an entire SRAM cell and portions of adjacent SRAM cells in the diagonally opposite corner regions of the rectangular region.

Various write assist schemes can be utilized to affect the write time $VDD_{MIN}$ of an 8T SRAM cell in accordance with an embodiment. For example, some of the possible write assist schemes are a negative bitline (NBL) assist scheme, the $D^3SBM$ assist scheme, Write WL Boost (WLB), and forward body bias on NMOS devices (nFBB). These write assist schemes can be combined in various configurations to optimize the $VDD_{MIN}$ which offers SRAM cell design flexibility in the power-area-complexity optimization in ultra wide voltage range (UWVR) designs.

In addition, various read enhancement schemes can be utilized to impact $VDD_{MIN}$ on the static-noise margin (SNM) of an 8T SRAM cell in accordance with an embodiment. For example, some of the possible read enhancement schemes are a supply boost scheme (SB) which raises the supply voltage at the source of the pull-up transistor, a negative voltage (NVSS) on the source of the pull-down transistor, boosting the RWL (WLB), and forward body bias on the pull-up transistors (FBB on PU). The combination of SB, NVSS, WLB, and FBB on PU enables a $VDD_{MIN}$ of about 0.35V.

The described read and write assist schemes utilize the ability of UTBB FDSOI technology to apply body bias and to enhance circuit functionality. The described zigzag multi-finger cell layout enables bit-interleaving which improves the soft error resilience (SER), and also supports up to 5 wordline tracks over a memory cell with minimal area penalty. Further, the layout separates the wells of the pull-up transistors to allow the $D^3SBM$ write assist scheme to be fully enabled. By utilizing the read and write assist schemes; the $VDD_{MIN}$ of the 8T SRAM cell is lowered to 0.35 mV.

Figure 5:
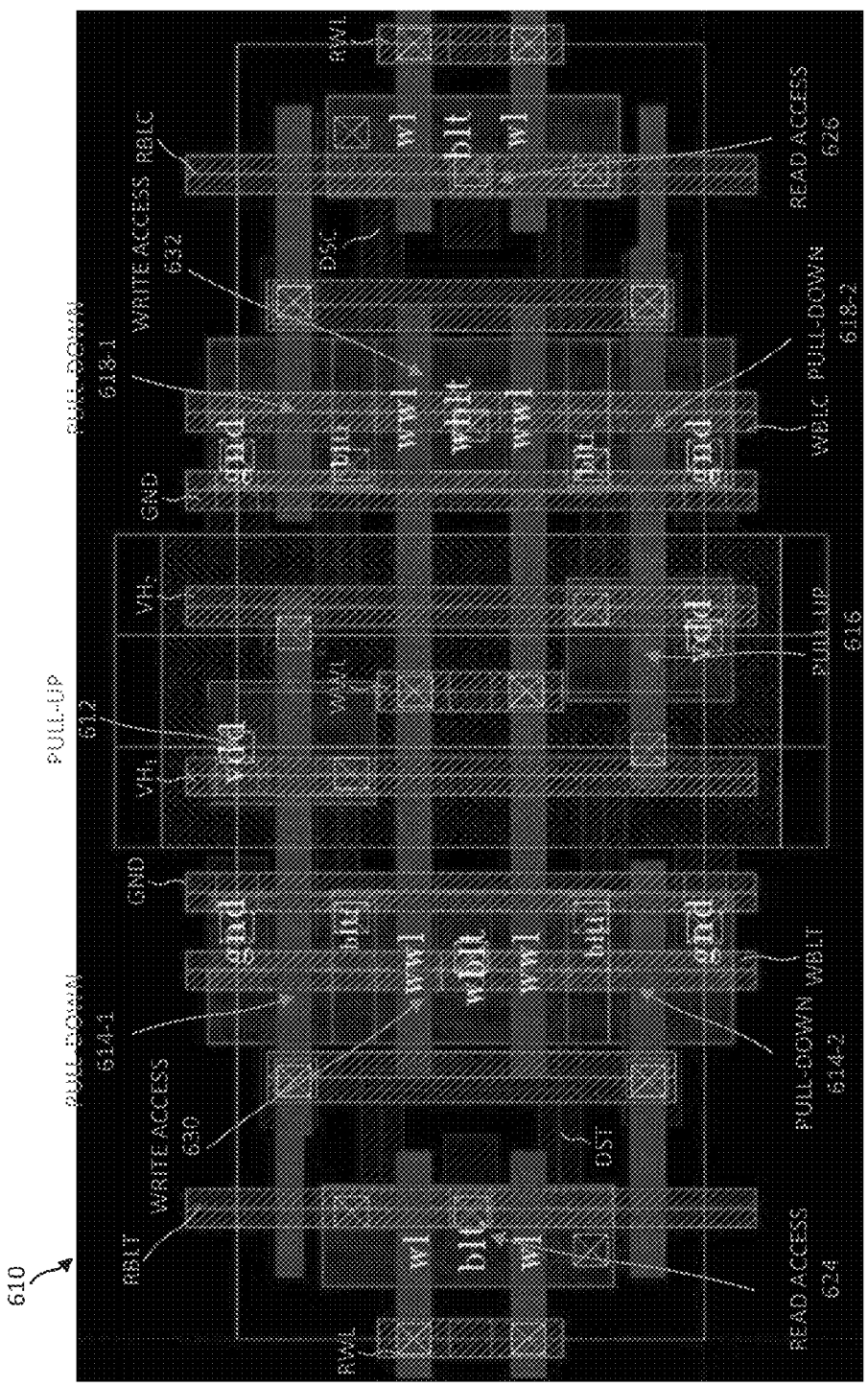
FIG. 5 illustrates another layout of an 8T SRAM cell in accordance with an embodiment.

FIG. 5 illustrates another layout of an 8T SRAM cell layout 610 in accordance with an embodiment. The 8T SRAM cell layout 610 includes pull-up transistors 612 and 616, pull-down transistors 614 and 618, read access transistors 624 and 626, and write access transistors 630 and 632. The last two digits of the reference labels for the transistors in the cell FIG. 5 match the last two digits of the corresponding transistor in the schematic diagram of FIG. 2. For example, pull-up transistor 612 in FIG. 5 corresponds to the pull-up transistor 112 in FIG. 2. The cell layout 610 may be formed by similar processes and steps as the previous embodiment in FIGS. 3A through 3F described above. Details of this embodiment that are similar to the embodiment in FIGS. 3A through 3F described above are not repeated herein.

In cell layout 610, the n-wells for the PMOS pull-up transistors 612 and 616 are in the center of the cell, the write access transistors 630 and 632 share active areas with the pull-down transistors 614 and 618, respectively and the read access transistors 624 and 626 are at the ends of the cell. The cell layout 610 provides a multi-gate (multi-finger) layout which improves SER robustness because each of the transistors are effectively divided into at least two parts and thus a particle strike will only affect one half of the transistor rather than the entire transistor. The cell layout 610 enables the independent modulation of the source supplies $V_{H1}$ and $V_{H2}$, while maintaining the PMOS pull-up bodies at a same potential, thereby implementing the $D^3SBM$ assist scheme only partially.

Figure 6:
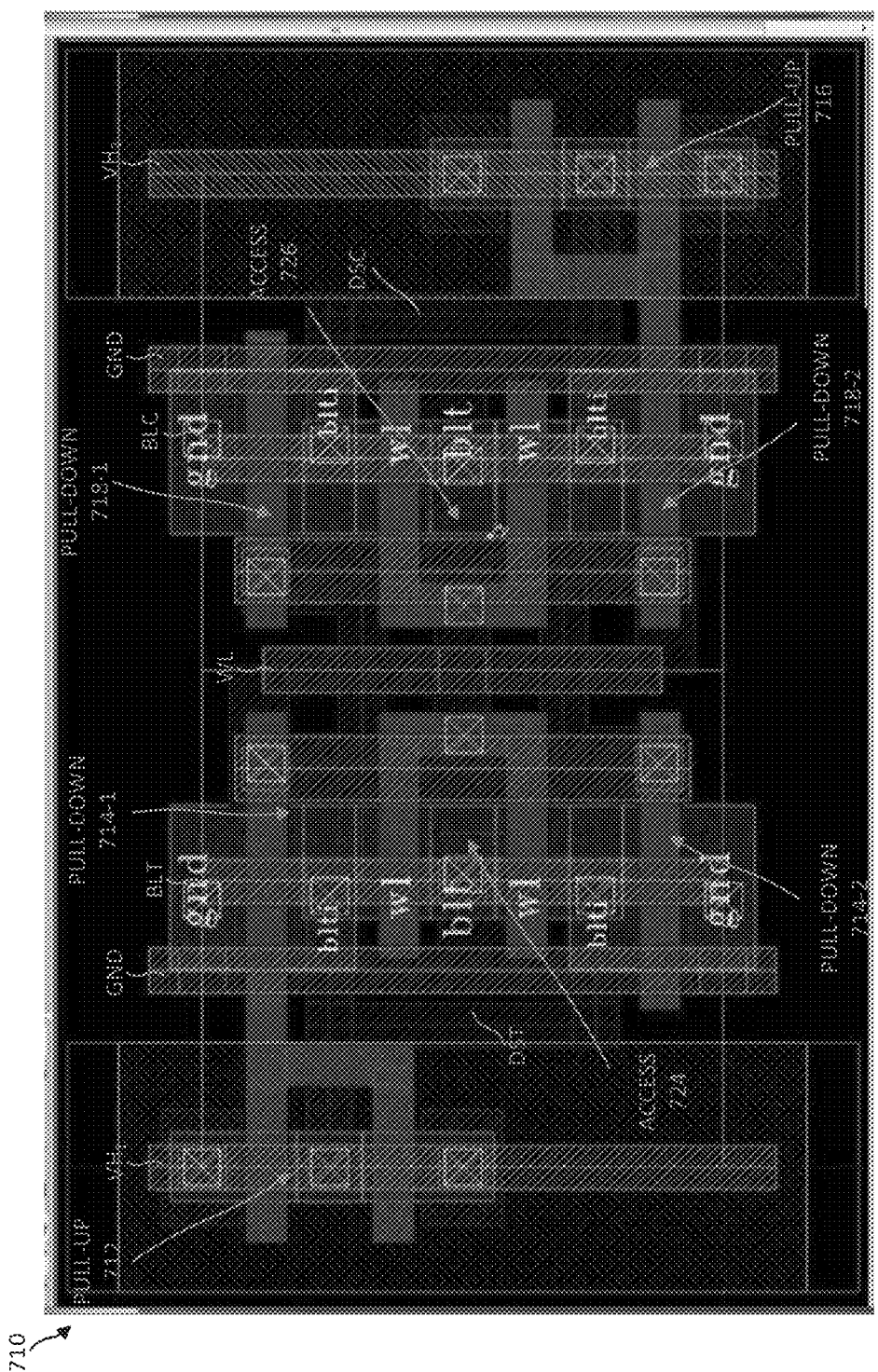
FIG. 6 illustrates a zigzag layout of a 6T SRAM cell in accordance with an embodiment.

FIG. 6 illustrates a zigzag layout of a 6T SRAM cell layout 710 in accordance with an embodiment. The 6T SRAM cell layout 710 includes pull-up transistors 712 and 716, pull-down transistors 714 and 718, and access transistors 714 and 726. The last two digits of the reference labels for the transistors in FIG. 6 match the last two digits of the corresponding transistor in the schematic diagram of FIG. 1. The cell layout 710 may be formed by similar processes and steps and as the previous embodiment in FIGS. 3A through 3F described above. Details of this embodiment that are similar to the previous embodiments described above are not repeated herein.

In cell layout 710, the n-wells for the PMOS pull-up transistors 712 and 716 are on outer edges of the cell layout 710 with one or more p-wells between these n-wells. The access transistors 724 and 726 share active areas with the pull-down transistors 714 and 718, respectively. The cell layout 710 provides a multi-gate (multi-finger) layout which improves SER robustness. The cell layout 710 fully enables the body biasing of the $D^3SBM$ assist scheme as the n-wells of the PMOS pull-up transistors 712 and 716 are separated in this embodiment.

Figure 7:
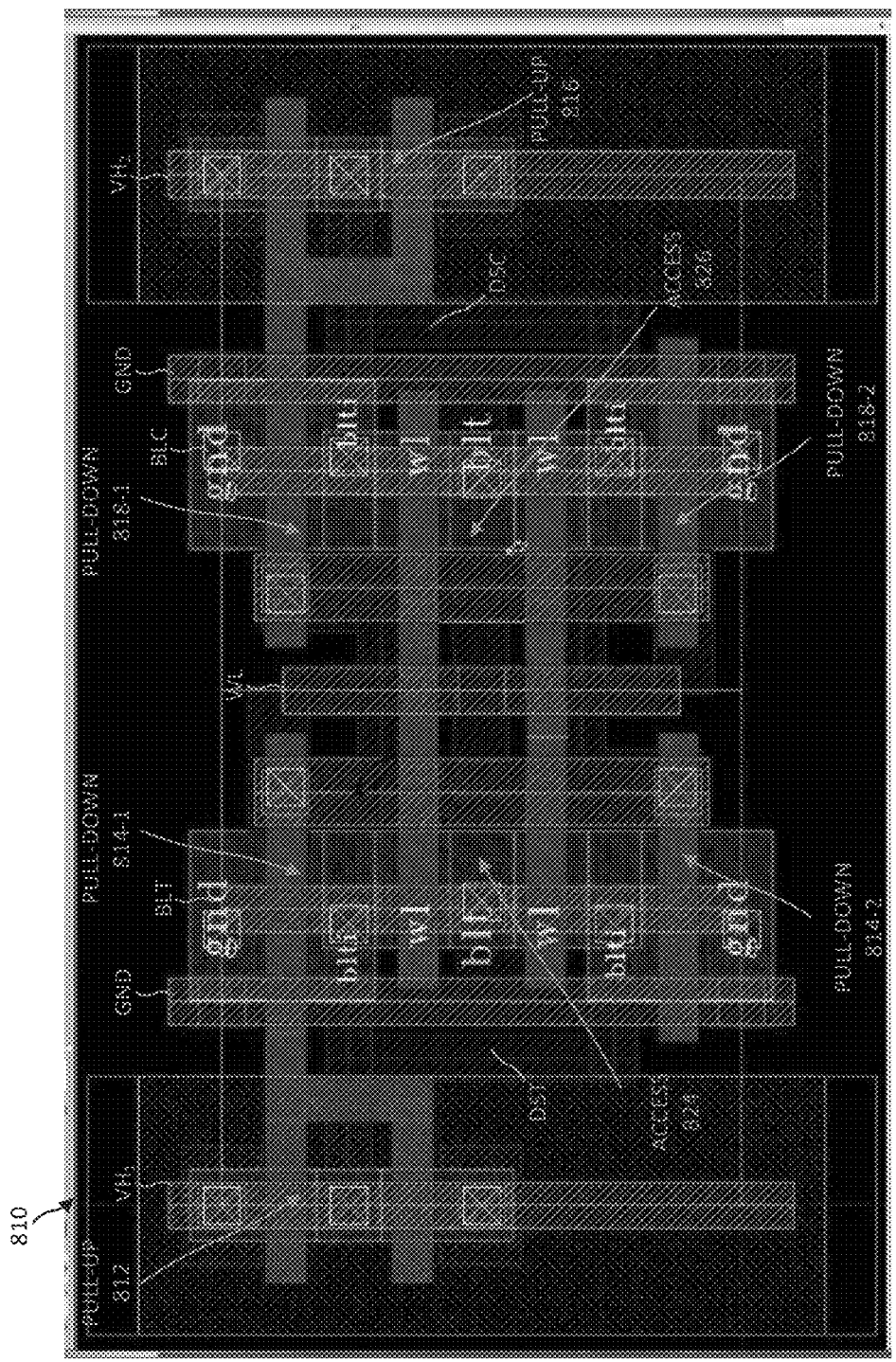
FIG. 7 illustrates a T-shaped layout of a 6T SRAM cell in accordance with an embodiment.

FIG. 7 illustrates a T-shaped layout of a 6T SRAM cell layout 810 in accordance with an embodiment. The 6T SRAM cell layout 810 includes pull-up transistors 812 and 816, pull-down transistors 814 and 818, and access transistors 824 and 826. The last two digits of the reference labels for the transistors in FIG. 7 match the last two digits of the corresponding transistor in the schematic diagram of FIG. 1. The cell layout 810 may be formed by similar processes and steps and as the previous embodiment in FIGS. 3A through 3F described above. Details of this embodiment that are similar to the previous embodiments described above are not repeated herein.

In cell layout 810, the n-wells for the PMOS pull-up transistors 812 and 816 are on outer edges of the cell layout 710 with one or more p-wells between these n-wells. In this embodiment, both of the PMOS pull-up transistors 812 and 816 are in the upper portions of the cell layout 810 to form a T-shaped cell as opposed to the zigzag cell layout 710 in FIG. 6 where the pull-up transistors are in diagonal corners of the cell. The access transistors 824 and 826 share active areas with the pull-down transistors 814 and 818, respectively. The cell layout 810 provides a multi-gate (multi-finger) layout which improves SER robustness. The cell layout 810 fully enables the body biasing of the $D^3SBM$ assist scheme as the n-wells of the PMOS pull-up transistors 812 and 816 are separated in this embodiment.

Figure 8:
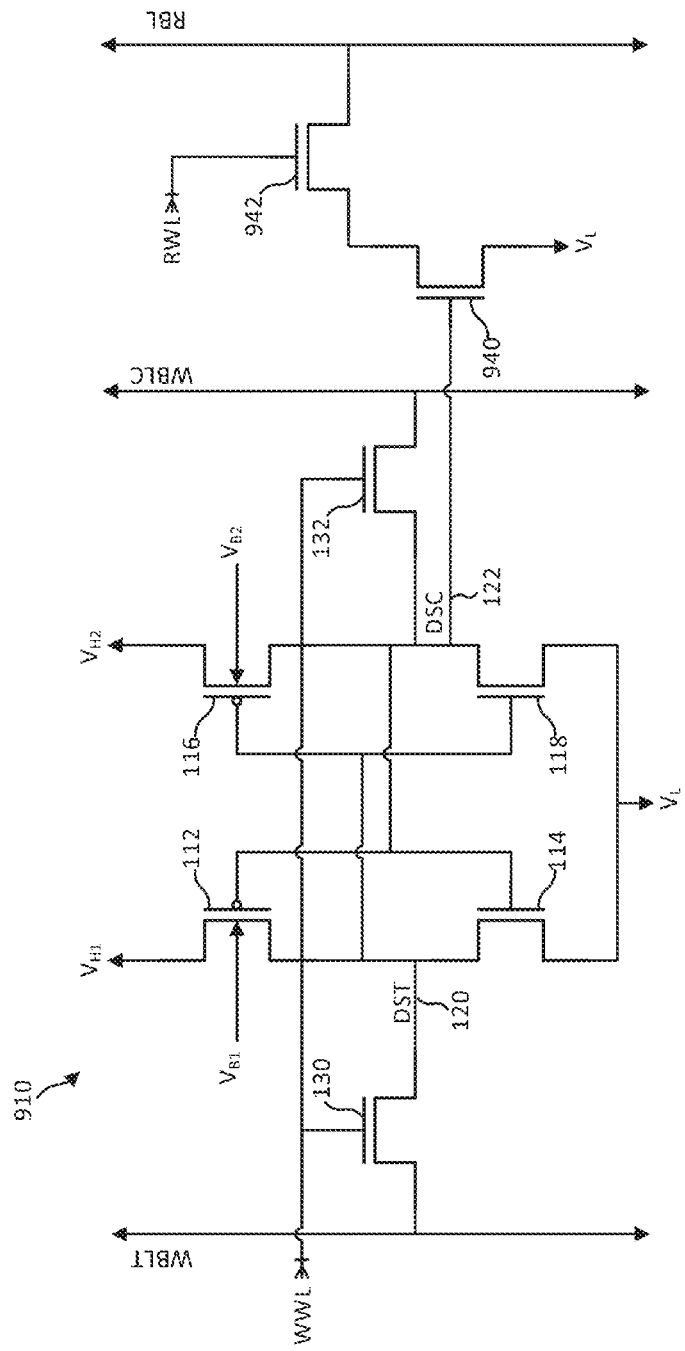
FIG. 8 illustrates a schematic diagram of an 8T SRAM cell in accordance with an embodiment.

FIG. 8 illustrates a schematic diagram of an 8T SRAM cell 910 in accordance with an embodiment. The cell 910 is similar to the SRAM cell 110 in FIG. 2 except that in this embodiment the WBLT and the WBLC are used to carry data during a write operation, while the RBL is used to carry data during a read operation. The RBL is coupled to the DSC node 122 through a series connection of an NMOS read control transistor 940 and an NMOS read access transistor 942. The gate of the read control transistor 940 is coupled to the DSC node 122 and the source of the read control transistor 940 is coupled to the reference voltage $V_L$. The gate of the read access transistor 942 is coupled to the RWL. The read and write operations, the body bias voltages $V_{B1}$ and $V_{B2}$, the high supply voltages $V_{H1}$ and $V_{H2}$, and the low supply voltage $V_L$ have been described above in FIG. 2 and their descriptions are not repeated herein.

Figure 9:
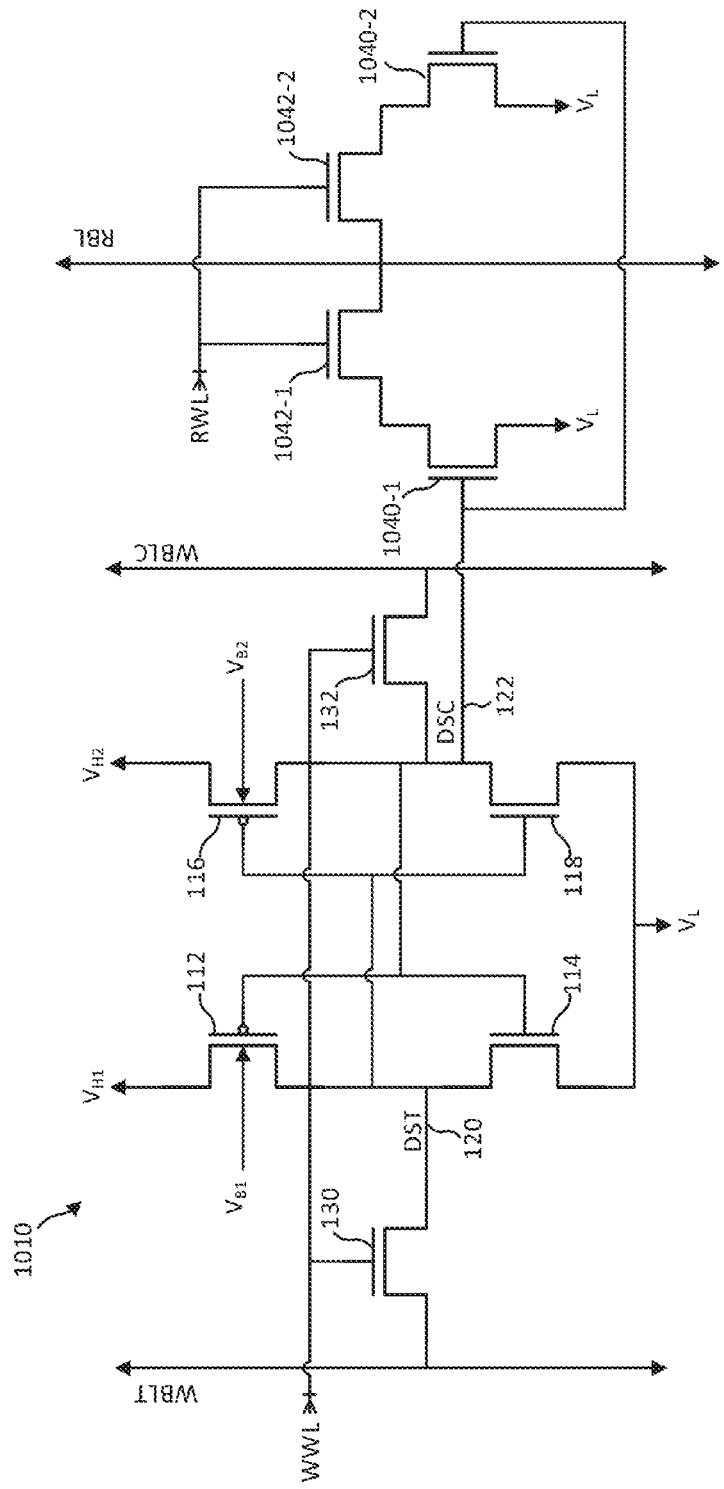
FIG. 9 illustrates a schematic diagram of 10T SRAM cell in accordance with an embodiment.

FIG. 9 illustrates a schematic diagram of a 10T SRAM cell in accordance with an embodiment. The cell 1010 is similar to the SRAM cell 910 in FIG. 8 except that in this embodiment there are two NMOS read control transistors 1040 (1040-1 and 1040-2) and two NMOS read access transistors 1042 (1042-1 and 1042-2). The RBL is coupled to the DSC node 122 through a first series connection of an NMOS read control transistor 1040-1 and an NMOS read access transistor 1042-1, and a second series connection of an NMOS read control transistor 1040-2 and an NMOS read access transistor 1042-2. The gates of the read control transistors 1040-1 and 1040-2 are coupled to the DSC node 122 and the sources of the read control transistors 1040-1 and 1040-2 are coupled to the reference voltage $V_L$. The gates of the read access transistors 1042-1 and 1042-2 are coupled to the RWL.

Figure 10:
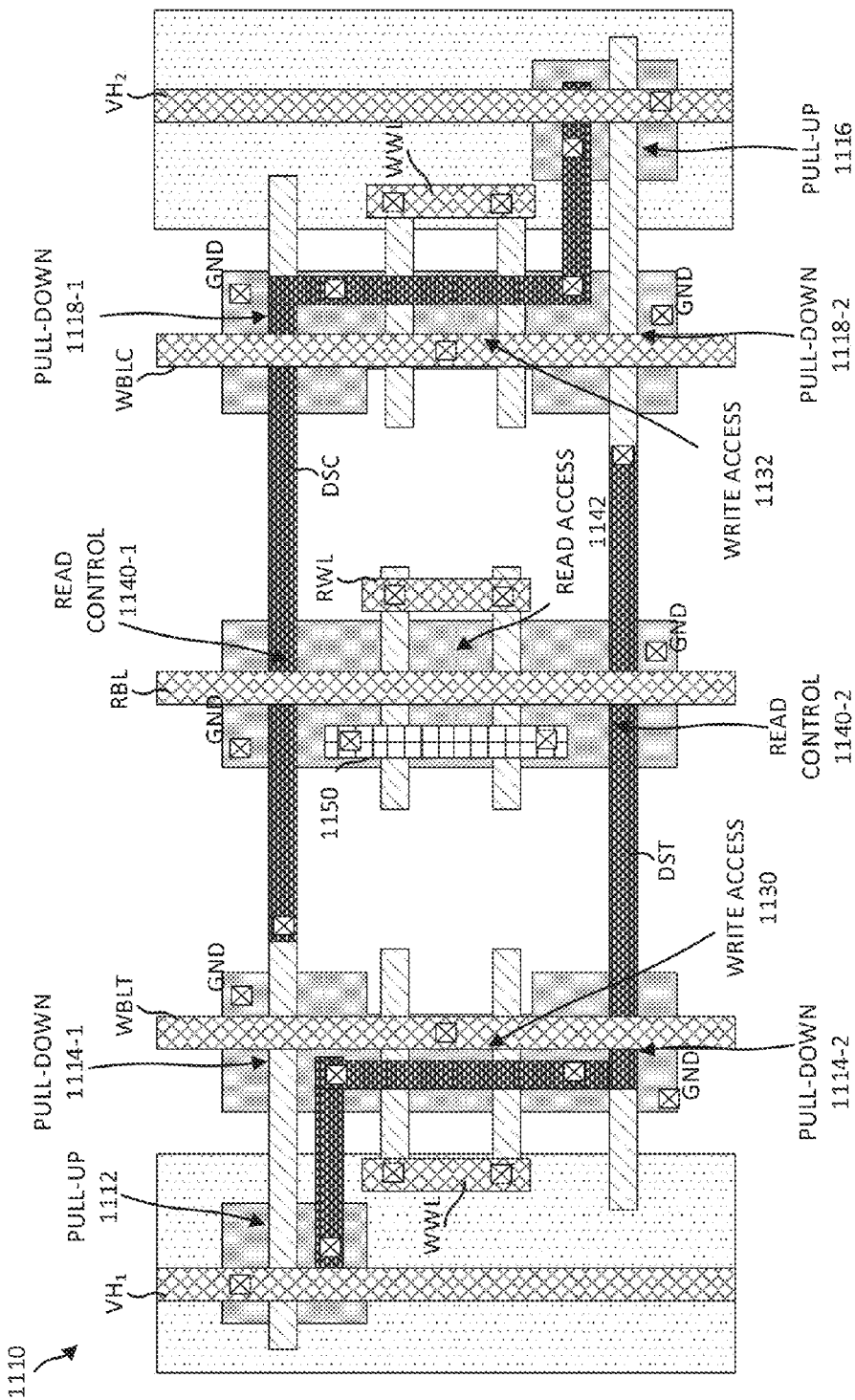
FIG. 10 illustrates a zigzag layout of an 8T or 10T SRAM cell in accordance with an embodiment.

FIG. 10 illustrates a zigzag layout 1110 of either the 8T SRAM cell in FIG. 8 or the 10T SRAM cell in FIG. 9 in accordance with an embodiment. The cell layout 1110 includes pull-up transistors 1112 and 1116, pull-down transistors 1114 and 1118, write access transistors 1130 and 1132, one or more read control transistors 1140, and one or more read access transistors 1142. The last two digits of the reference labels for the transistors in FIG. 10 match the last two digits of the corresponding transistor in the schematic diagrams of FIGS. 12 and 13. The cell layout 1110 may be formed by similar processes and steps and as the previous embodiment in FIGS. 3A through 3F described above. Details of this embodiment that are similar to the previous embodiments described above are not repeated herein.

In cell layout 1110, the n-wells for the PMOS pull-up transistors 712 and 716 are on outer edges of the cell layout 710 with one or more p-wells between these n-wells. The write access transistors 1130 and 1132 share active areas with the pull-down transistors 1114 and 1118, respectively. The one or more read control transistors 1140 share an active area with the one or more read access transistors 1142. For the 8T SRAM cell 910 illustrated in FIG. 8, an intra-cell connection 1150 is present to couple the drains of read control transistors 1140 (940 in FIG. 8) and the sources of the read access transistors 1142 (942 in FIG. 8) together to form a single read control transistor 1140 and a single read access transistor 1142. When the intra-cell connection 1150 is not present, the read control transistor 1140 and the read access transistor 1142 are each split into two separate transistors forming the 10T SRAM cell 1010 illustrated in FIG. 9. The cell layout 1110 provides a multi-gate (multi-finger) layout which improves SER robustness. The cell layout 1110 fully enables the body biasing of the $D^3SBM$ assist scheme as the n-wells of the PMOS pull-up transistors 1112 and 1116 are separated in this embodiment.

Figure 11:
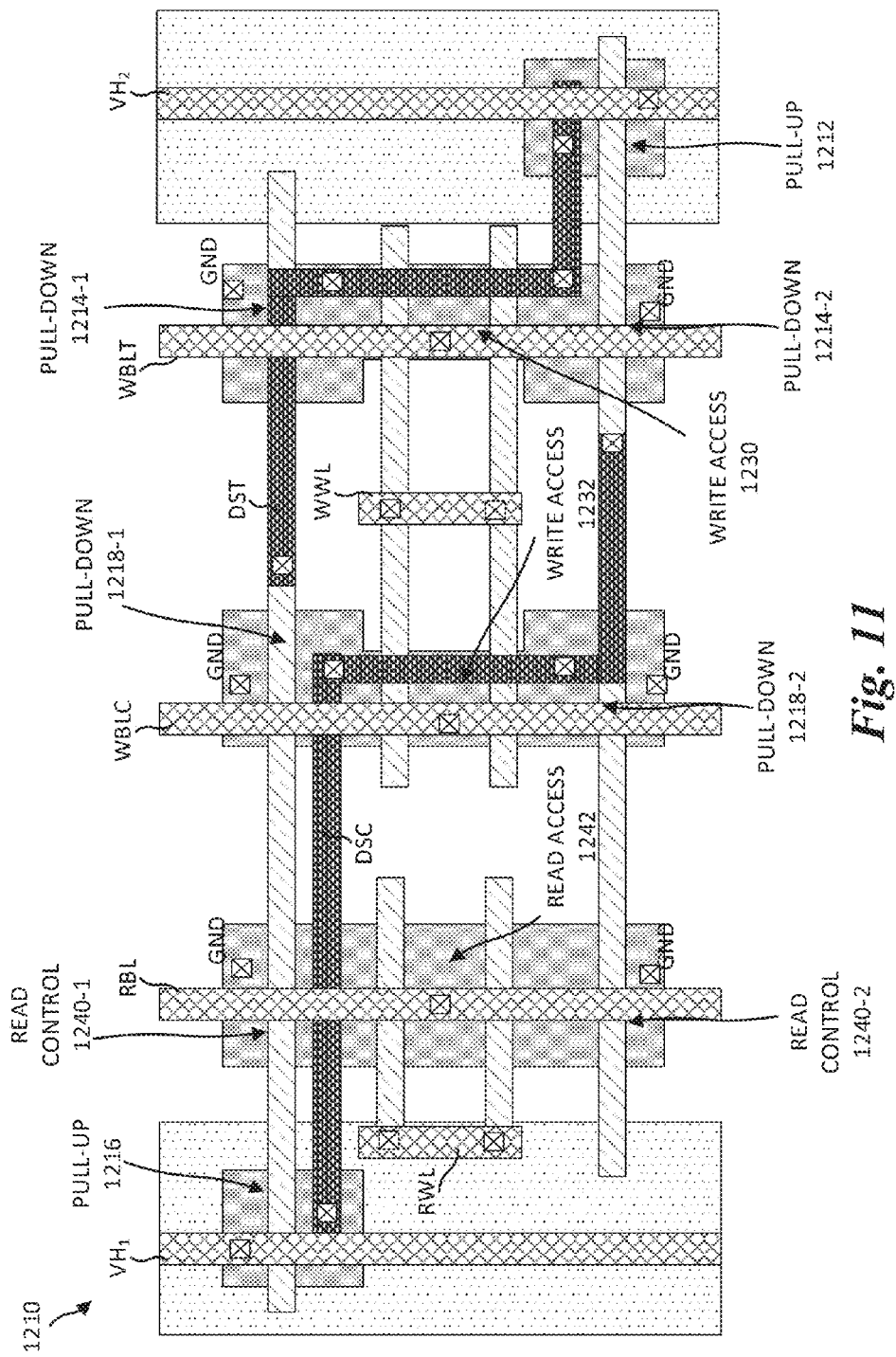
FIG. 11 illustrates a zigzag layout of a 10T SRAM cell in accordance with an embodiment.

FIG. 11 illustrates a zigzag layout 1210 the 10T SRAM cell in FIG. 9 in accordance with an embodiment. The cell layout 1210 includes pull-up transistors 1212 and 1216, pull-down transistors 1214 and 1218, write access transistors 1230 and 1232, read control transistors 1240-1 and 1240-2, and read access transistors 1242-1 and 1242-2. The last two digits of the reference labels for the transistors in FIG. 11 match the last two digits of the corresponding transistor in the schematic diagram of FIG. 9. The cell layout 1210 may be formed by similar processes and steps and as the previous embodiment in FIGS. 3A through 3F described above. Details of this embodiment that are similar to the previous embodiments described above are not repeated herein.

The cell layout 1210 is similar to the cell layout 1110 except that in this embodiment the write access transistors 1230 and 1232 are in adjacent active areas and share common gates. The read control transistors 1240 and the read access transistors 1242 have been moved to be adjacent one of the n-wells of the pull-up transistors rather than between p-wells in the cell layout 1110.

Although the cell layouts in FIGS. 3, 5, 6, 7, 10, and 11 illustrate GND traces or nodes, these traces and nodes are not limited to a ground voltage (e.g., 0 V) as these traces and nodes may be the low voltage node $V_L$ as described above.

In addition, by having a layout that supports multi-gate (multi-finger) transistors, the gate length of the transistors in the various SRAM cells of this disclosure can be configured to maximize the layout area while maintaining the appropriate sizing for the transistors. For example, an access transistor can have its gate length divided by 2 and its number of gates (fingers) doubled to effectively have an access transistor of the same size but with a different layout area. In another example, a pull-down transistor can have its gate length divided by 3 and its number of gates (fingers) tripled to effectively have a pull-down transistor of the same size but with a different layout area.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An array of static random access memory (SRAM) cells comprising:
    a plurality of overlapping rectangular regions, each of the overlapping rectangular regions comprises:
        an entire first SRAM cell;
        a portion of a second adjacent SRAM cell in a first corner region of the rectangular region; and
        a portion of a third adjacent SRAM cell in a second corner region of the rectangular region, the second corner region being opposite the first corner region.

2. The array of SRAM cells of claim 1, wherein each of the overlapping rectangular regions further comprises:
    a first continuous well region extending through the first SRAM cell and the portion of the second adjacent SRAM cell in the first corner region of the rectangular region; and
    a second continuous well region extending through the first SRAM cell and the portion of the third adjacent SRAM cell in the second corner region of the rectangular region.

3. The array of SRAM cells of claim 2, wherein the first continuous well region and the second continuous well region are each n-well regions; and
    wherein each of the overlapping rectangular regions further comprises:
        at least one p-well interposed between the first continuous n-well region and the second continuous n-well region.

4. The array of SRAM cells of claim 1, wherein each of the overlapping rectangular regions further comprises:
    a first pull-up transistor of the first SRAM cell in a third corner region of the rectangular region, the third corner region being adjacent the first corner region; and
    a second pull-up transistor of the first SRAM cell in a fourth corner region of the rectangular region, the fourth corner region being adjacent the second corner region and opposite the third corner region.

5. The array of SRAM cells of claim 4, wherein the fourth corner region is diagonally opposite the third corner region.

6. The array of SRAM cells of claim 4, wherein the first pull-up transistor is a p-channel MOSFET (PMOS) transistor, and wherein the second pull-up transistor is a PMOS transistor.

7. The array of SRAM cells of claim 4, wherein the first pull-up transistor comprises more than one gate electrode extending over an active area of the first pull-up transistor, and wherein the second pull-up transistor comprises more than one gate electrode extending over an active area of the second pull-up transistor.

8. The array of SRAM cells of claim 4, wherein the first SRAM cell further comprises:
    a first pull-down transistor;
    a first read access transistor;
    a first write access transistor;
    a second pull-down transistor;
    a second read access transistor; and
    a second write access transistor, wherein active areas for each of the first pull-down transistor, the first read access transistor, the first write access transistor, the second pull-down transistor, the second read access transistor, and the second write access transistor are between the first pull-up transistor and the second pull-up transistor.

9. The array of SRAM cells of claim 8, wherein the first pull-down transistor comprises:
    a first gate electrode extending over a first active area of the first pull-down transistor and an active area of the first pull-up transistor; and
    a second gate electrode over a second active area of the first pull-down transistor, the second active area of the first pull-down transistor separated from the first active area of the first pull-down transistor by an active area of the first read access transistor.

10. The array of SRAM cells of claim 8, wherein the first read access transistor comprises two gate electrodes over an active area of the first read access transistor.

11. The array of SRAM cells of claim 1, wherein the array of SRAM cells comprises an array of 6 transistor (6T) SRAM cells.

12. The array of SRAM cells of claim 1, wherein the array of SRAM cells comprises an array of 8 transistor (8T) SRAM cells.

13. The array of SRAM cells of claim 1, wherein the array of SRAM cells comprises an array of 10 transistor (10T) SRAM cells.

14. The array of SRAM cells of claim 1, wherein the second corner region is diagonally opposite the first corner region.

15. A static random access memory (SRAM) cell comprising:
    a first pull-up transistor having an active area in a first substrate;
    a second pull-up transistor having an active area in the first substrate;

a first pull-down transistor having an active area in the first substrate; and a first access transistor having an active area in the first substrate, wherein the active areas for the first pull-down transistor and the first access transistor are between the active areas of the first pull-up transistor and the second pull-up transistor.

16. The SRAM cell of claim 15, wherein the active areas for the first pull-up transistor and the second pull-up transistor are n-wells, and wherein the active areas for the first pull-down transistor and the first access transistor are p-wells.

17. The SRAM cell of claim 15, wherein the active areas for the first pull-down transistor and the first access transistor are a common active area.

18. The SRAM cell of claim 15, wherein the active areas for the first pull-down transistor and the first access transistor are separate active areas.

19. The SRAM cell of claim 15 further comprising:
wherein the first pull-up transistor is coupled between a first supply node and a true data storage node; and
a first supply circuit configured to apply a first supply voltage to the first supply node when writing a logic low value to the true data storage node and apply a second supply voltage to the first supply node when writing a logic high value to the true data storage node.

20. The SRAM cell of claim 19, wherein the first supply circuit is further configured to apply the second supply voltage to the first supply node when reading from the true data storage node.

21. The SRAM cell of claim 19, wherein the first supply voltage is greater than the second supply voltage.

22. The SRAM cell of claim 19, wherein the first pull-up transistor is a p-channel MOSFET and the first supply node is a source node of the p-channel MOSFET.

23. The SRAM cell of claim 15 further comprising:
a second pull-down transistor;
a second read access transistor, wherein the first access transistor is a first read access transistor;
a first write access transistor; and
a second write access transistor, wherein each of the first pull-up transistor, the second pull-up transistor, the first pull-down transistor, the second pull-down transistor, the first read access transistor, the second read access transistor, the first write access transistor, and the second write access transistor have more than one gate electrodes extending over their respective active areas.

24. A static random access memory (SRAM) cell comprising:
a first pull-up transistor;
a first pull-down transistor;
a first read access transistor;
a second pull-up transistor;
a second pull-down transistor; and
a second read access transistor, wherein active areas of each of the first pull-down transistor, the first read access transistor, the second pull-down transistor, and the second read access transistor have more than one gate electrodes extending over their respective active areas.

25. The SRAM cell of claim 24, wherein active areas of each of the first pull-down transistor, the first read access transistor, the second pull-down transistor, and the second read access transistor are between the active area of the first pull-up transistor and the active area of the second pull-up transistor.

26. The SRAM cell of claim 24, wherein the active areas of the first pull-down transistor and the first read access transistor are a first connected active area, wherein the active areas for the second pull-down transistor and the second read access transistor are a second connected active area.

27. The SRAM cell of claim 24 further comprising:
a first write access transistor; and
a second write access transistor, wherein active areas of each of the first write access transistor and the second write access transistor are between the active area of the first pull-up transistor and the active area of the second pull-up transistor.

28. The SRAM cell of claim 27, wherein the active areas of the first pull-down transistor and the first read access transistor are a first connected active area, wherein the active areas for the second pull-down transistor and the second read access transistor are a second connected active area, and wherein the active areas of the first write access transistor and the second write access transistor are between the first connected active area and the second connected active area.

29. The SRAM cell of claim 27, wherein the active areas of the first write access transistor and the second write access transistor are spaced apart from each other.

30. The SRAM cell of claim 27 further comprising:
a first gate electrode over the active area of the first pull-up transistor and a first active area of the first pull-down transistor;
a second gate electrode over a second active area of the first pull-down transistor, the second active area of the first pull-down transistor separated from the first active area of the first pull-down transistor by the active area of the first read access transistor, the first and second gate electrodes having substantially parallel longitudinal axes; and
a first linear intra-cell connection electrically coupling the first gate electrode to the second gate electrode.

31. The SRAM cell of claim 30 further comprising:
a first intra-cell connection electrically coupling the first gate electrode, the active area of the second write access transistor, the active area of the second read access transistor, the active area of the second pull-down transistor, and the active area of the second pull-up transistor.

32. The SRAM cell of claim 31, wherein the first intra-cell connection is a true data storage node for the SRAM cell.

33. The SRAM cell of claim 30 further comprising:
a third gate electrode over the active area of the second pull-up transistor and a first active area of the second pull-down transistor;
a fourth gate electrode over a second active area of the second pull-down transistor, the second active area of the second pull-down transistor separated from the first active area of the second pull-down transistor by the active area of the second read access transistor, the third and fourth gate electrodes having substantially parallel longitudinal axes; and
a second linear intra-cell connection electrically coupling the third gate electrode to the fourth gate electrode.

34. The SRAM cell of claim 33 further comprising:
a second intra-cell connection electrically coupling the third gate electrode, the active area of the first write access transistor, the active area of the first read access transistor, the active area of the first pull-down transistor, and the active area of the first pull-up transistor.

35. The SRAM cell of claim 34, wherein the second intra-cell connection is a complement data storage node for the SRAM cell.

36. The SRAM cell of claim 24, wherein the first pull-up transistor and the second pull-up transistor have more than one gate electrodes extending over their respective active areas.

* * * * *